United States Patent
Wei et al.

(10) Patent No.: US 8,536,491 B2
(45) Date of Patent: Sep. 17, 2013

(54) ROTATABLE AND TUNABLE HEATERS FOR SEMICONDUCTOR FURNACE

(75) Inventors: Zin-Chang Wei, Hsin-Chu (TW); Hsin-Hsien Wu, Hsinchu (TW); Chun-Lin Chang, Jhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 1185 days.

(21) Appl. No.: 12/409,880

(22) Filed: Mar. 24, 2009

(65) Prior Publication Data

US 2010/0248496 A1    Sep. 30, 2010

(51) Int. Cl.
*F27D 11/00* (2006.01)
*H01L 21/31* (2006.01)
*H01L 21/44* (2006.01)

(52) U.S. Cl.
USPC .......... 219/385; 219/390; 219/395; 438/758; 438/680

(58) Field of Classification Search
USPC ............... 219/385, 638, 390, 395, 391, 402, 219/404, 406, 410, 405, 411, 409; 373/111, 373/117, 127, 128, 129, 130; 118/725, 724, 118/50.1; 438/758, 781, 660, 680
See application file for complete search history.

(56) References Cited

U.S. PATENT DOCUMENTS

| | | | |
|---|---|---|---|
| 2,961,305 A * | 11/1960 | Dash | 117/34 |
| 6,031,205 A | 2/2000 | Shimazu | |
| 6,095,806 A | 8/2000 | Suzuki et al. | |
| 6,168,427 B1 | 1/2001 | Cho et al. | |
| 6,177,660 B1 * | 1/2001 | Usui et al. | 219/631 |
| 6,187,102 B1 | 2/2001 | Yamamoto | |
| 6,367,371 B1 * | 4/2002 | Ni | 219/389 |
| 6,423,949 B1 | 7/2002 | Chen et al. | |
| 6,435,865 B1 | 8/2002 | Tseng et al. | |
| 6,483,082 B1 | 11/2002 | Liao et al. | |
| 6,538,237 B1 | 3/2003 | Yang et al. | |
| 7,011,866 B1 * | 3/2006 | Yamanaka et al. | 427/255.28 |
| 7,241,701 B2 | 7/2007 | Dotsikas | |
| 2003/0183614 A1 * | 10/2003 | Yamaguchi et al. | 219/390 |
| 2003/0222073 A1 * | 12/2003 | Moon et al. | 219/404 |
| 2007/0243317 A1 * | 10/2007 | Du Bois et al. | 427/98.9 |
| 2008/0142497 A1 * | 6/2008 | Sorabji et al. | 219/393 |

FOREIGN PATENT DOCUMENTS

| | | | |
|---|---|---|---|
| CN | 1618120 A | | 5/2005 |
| JP | 5166739 A | | 7/1993 |
| JP | 2003-303781 A | * | 10/2003 |

OTHER PUBLICATIONS

English translation—Specification of Kadobe et al.; JP 2003-303781; Oct. 24, 2003.*
English translation—Abstract of Kadobe et al.; JP 2003-303781; Oct. 24, 2003.*
Official Action issued by SIPO on Jul. 20, 2011 in counterpart Chinese patent application.

* cited by examiner

*Primary Examiner* — Quang Van
*Assistant Examiner* — Hung D Nguyen
(74) *Attorney, Agent, or Firm* — Duane Morris LLP

(57) ABSTRACT

A semiconductor furnace suitable for chemical vapor deposition processing of wafers. The furnace includes a thermal reaction chamber having a top, a bottom, a sidewall, and an internal cavity for removably holding a batch of vertically stacked wafers. A heating system is provided that includes a plurality of rotatable heaters arranged and operative to heat the chamber. In one embodiment, spacing between the sidewall heaters is adjustable. The heating system controls temperature variations within the chamber and promotes uniform film deposit thickness on the wafers.

17 Claims, 5 Drawing Sheets

ROTATABLE AND TUNABLE HEATERS FOR SEMICONDUCTOR FURNACE

FIELD OF THE INVENTION

The present invention generally relates to semiconductors, and more particularly to heating systems used in semiconductor furnaces for wafer processing.

BACKGROUND

Modern semiconductor electronic device packages such as integrated circuit (IC) chips are formed on a wafer by building multiple stacked layers of materials and components on a semiconductor substrate. A single wafer will contain a plurality of individual ICs or dies, which are later separated following fabrication by a cutting process referred to in the art as singulation or dicing. The semiconductor devices typically incorporate numerous electrically active components which are formed in multiple layers of an electrically insulating or dielectric material. Metal conductor interconnects, which may be made of copper in some embodiments, are formed by various additive patterning and deposition processes such as damascene and dual damascene to electrically couple the active components together in the various layers and to create circuit paths or traces within a single layer of dielectric material. Modern semiconductor fabrication entails a repetitive sequence of process steps including material deposition (conductive and non-conductive dielectric materials), photolithographic patterning of circuits in the dielectric material, and material removal such as etching and ashing which gradually build the stacked semiconductor device structures.

Some of the foregoing semiconductor processing steps used in fabricating semiconductors specifically include oxidation, diffusion, doping, annealing, and chemical vapor deposition (CVD). These processes are typically performed at elevated temperatures within heated controlled environments. CVD is a chemical vapor deposition process used to produce or deposit thin films of material on the wafer including without limitation metals, silicon dioxide, tungsten, silicon nitride, silicon oxynitride, and various dielectrics. The CVD process entails placing a wafer or plurality of wafers in a heated reaction chamber and introducing one or more reactant gases into the chamber. The gases contain with various chemical precursors (e.g. $SiH_2Cl_2$ and $NH_3$ or silane and $NH_3$ to form a silicon nitride film) that react at the heated wafer surface to form a thin film of the desired semiconductor material and thickness thereon. The uniformity of the film deposited on the wafer by CVD is affected and controlled by regulating and attempting to optimize CVD process parameters such as temperature of the wafer, reaction chamber pressure, flow path and rate of reactant gases, and deposition time or duration.

One type of heated or thermal reaction chamber used in CVD processes are vertical semiconductor furnaces. These vertical furnaces are capable of holding a plurality of vertically-stacked semiconductor wafers which undergo CVD batch processing simultaneously. The vertical furnaces include a thermal reaction vessel or chamber which may be loaded with multiple wafers that in some embodiments are held in a vertically-stackable rack referred to in the art as a wafer ladder or boat. The wafer boat comprises a frame having multiple horizontal slots which each hold an individual wafer in spaced-apart, stacked vertical relationship to the other wafers. The wafer boats may typically hold from approximately 50-125 wafers. Vertical space is provided between the wafers to allow the CVD reactant gases to circulate therethrough for forming the desired material film deposits on top of the wafers. The thermal reaction chambers are commonly cylindrical in shape (also referred to as reaction tubes) and generally have a closed top and open bottom to allow for insertion of the wafer boats holding the vertical wafer stacks.

The thermal reaction chambers, wafer boats or racks, and other components that may be exposed to the heat and corrosive gases are commonly made of quartz or SiC to withstand CVD process temperatures that may range from about 200-1200 degrees C. in some applications depending on the type of semiconductor material film to be deposited on the wafers.

The wafer boats may be disposed on an openable/closeable lid assembly which forms a bottom closure and platform for supporting the wafer boat. The lid assembly is configured and adapted to temporarily attach to and seal the bottom of the reaction chamber to form a gas-tight temporary connection during CVD processing. The lid assembly may be mounted on a vertical elevator or lift which is operable to raise and lower the wafer boat into and from the reaction chamber. The reaction chamber and associated assembly typically includes a gas manifold with gas inlets and gas outlets for introducing and removing CVD process reactant gases from the reaction chamber. A means for rotating the wafer boat and wafers held therein when the boat is positioned in the reaction chamber may be provided to promote uniform gas flow and heating throughout the wafer stack.

Some examples of conventional vertical semiconductor furnaces and associated appurtenances are shown in U.S. Pat. Nos. 6,538,237; 6,435,865; 6,187,102; 6,031,205; and 7,241,701; all of which are incorporated herein by reference in their entireties.

The vertical semiconductor furnaces include a heat source, which in some embodiments may include resistance type heaters, radiant type heaters, or a combination thereof. Examples of resistance type heaters include electric resistive wire coil elements or similar. Some examples of radiant type heaters include heating lamps or quartz-heating elements. The heaters are typically disposed outside but proximate to the quartz reaction chamber to heat the chamber and increase its internal temperature.

In order to improve manufacturing efficiencies and reduce production costs, wafer sizes have steadily increased over the years. Standard silicon wafer sizes have steadily grown from about 200 mm (about 8 inches diameter) to 300 mm (about 12 inches diameter). The next generation wafer standard has been set for 450 mm (about 18 inches in diameter). The next generation wafer size of 450 mm has created a challenge in maintaining a uniform temperature in the vertical wafer stacks throughout the wafer boat during the CVD process that is desired to promote uniform material film deposition on each wafer's surface.

Existing heater arrangements used in CVD thermal reaction chambers have proven to be inadequate to provide the needed uniformity in temperature for maintaining the desired consistency in both material film thickness deposited over the entire surface of each individual wafer, and from wafer-to-wafer throughout the entire batch or stack of wafers being processed for the larger next generation wafer sizes. Ideally, each wafer in the entire batch of wafers undergoing CVD in the thermal reaction chamber should have a uniform film thickness in order to meet acceptable process thickness variation tolerances on an individual wafer and wafer-to-wafer basis. Some existing heater arrangements used for traditionally smaller 200-300 mm diameter wafers do not provide the necessary temperature control and uniformity to maintain the desired tolerances for 450 mm wafers. Horizontal temperature variation between the edges and center of the wafers cause generally unacceptable variances in layer thicknesses deposited on each wafer. Temperatures at the wafer center are typically lower than at the edges. Vertical temperature variations in the stack of wafers held by the wafer boat cause generally unacceptable variances in layer thicknesses deposited from wafer-to-wafer in the stack.

An improved heater arrangement for vertical semiconductor furnaces is desired to meet the challenges of the next generation wafer size.

SUMMARY

According to one embodiment, a semiconductor furnace suitable for chemical vapor deposition wafer processing includes a vertical thermal reaction chamber having a sidewall defining a height, a top, a bottom, and an internal cavity for removable holding a batch of wafers. The semiconductor furnace further includes a wafer boat positioned in the reaction chamber being configured and adapted to hold a plurality of wafers in vertically-stacked relationship, and a heating system comprising a plurality of sidewall heaters spaced along the height of the reaction chamber which are arranged and operative to heat the chamber. The heating system includes user-adjustable sidewall heater spacing and sidewall heater rotation with variable rotational speed and direction being adjustable for each heater. The function of heater rotation is preferably independent for each heater and the tuning or adjustment of heater spacing is independent in some embodiments. Advantageously, the foregoing heater system promotes uniform wafer film deposit thickness on each wafer and from wafer-to-wafer in each batch processed in the semiconductor furnace by providing more flexibility to tune temperature profiles to get desired temperature and/or wafer uniformity.

According to another embodiment, a semiconductor furnace includes a vertical thermal reaction chamber having a sidewall defining height and an internal cavity for removably holding a batch of wafers. The semiconductor furnace further includes a wafer boat positionable in the reaction chamber being configured and adapted to hold a plurality of wafers in vertically-stacked relationship. A heating system is provided that includes a plurality of rotatable sidewall heaters spaced along the height of the reaction chamber. The sidewall heaters are rotatable with respect to the reaction chamber about a rotational axis. The sidewall heaters define a plurality of sidewall heater zones in the reaction chamber that are vertically spaced along the height of the reaction chamber with temperature in each heater zone being controlled by a respective sidewall heater. In one embodiment, the sidewall heater zones are adjustable in vertical position with respect to the reaction chamber.

According to another embodiment, a semiconductor furnace includes: a vertical thermal reaction chamber having a sidewall defining a height and an internal cavity for removably holding a batch of wafers. The semiconductor furnace further includes a wafer boat positionable in the reaction chamber being configured and adapted to hold a plurality of wafers in vertically-stacked relationship. A heating system is provided that includes a plurality of sidewall heaters spaced vertically along the height of the reaction chamber. In this embodiment, the spacing between the sidewall heaters is adjustable for optimizing temperature profiles within the reaction chamber.

A method for forming a layer of material on a semiconductor wafer is provided. The method includes providing a semiconductor furnace including a vertical thermal reaction chamber having a sidewall defining a height and an internal cavity for removably holding a batch of wafers. The semiconductor furnace further includes a heating system comprising a plurality of rotatable sidewall heaters spaced along the height of the reaction chamber. The method further includes inserting a wafer boat holding a plurality of vertically-stacked wafers into the reaction chamber, rotating at least one of the sidewall heaters with respect to the reaction chamber; and forming a film of material on each wafer via chemical vapor deposition. In some embodiments, the method further includes a step of raising or lowering at least one of the sidewall heaters with respect to the reaction chamber.

BRIEF DESCRIPTION OF THE DRAWINGS

The features of the preferred embodiments will be described with reference to the following drawings where like elements are labeled similarly, and in which.

Figure 1:
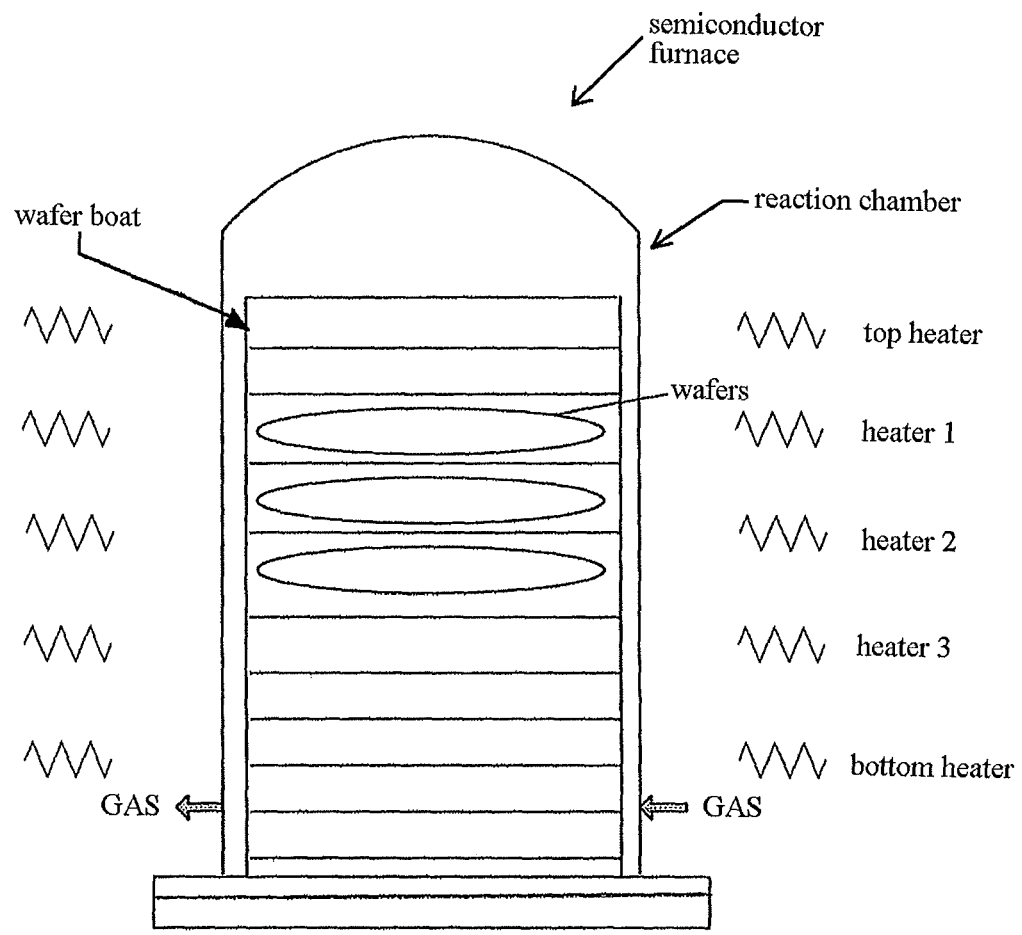
FIG. 1 is a schematic cross-sectional side view of a first existing heater arrangement for a semiconductor furnace.

All drawings are schematic and are not drawn to scale.

DETAILED DESCRIPTION

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present invention. Relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the preferred embodiments. Accordingly, the invention expressly should not be limited to such preferred embodiments illustrating some possible non-limiting combination of features that may exist alone or in other combinations of features; the scope of the invention being defined by the claims appended hereto.

Figure 2:
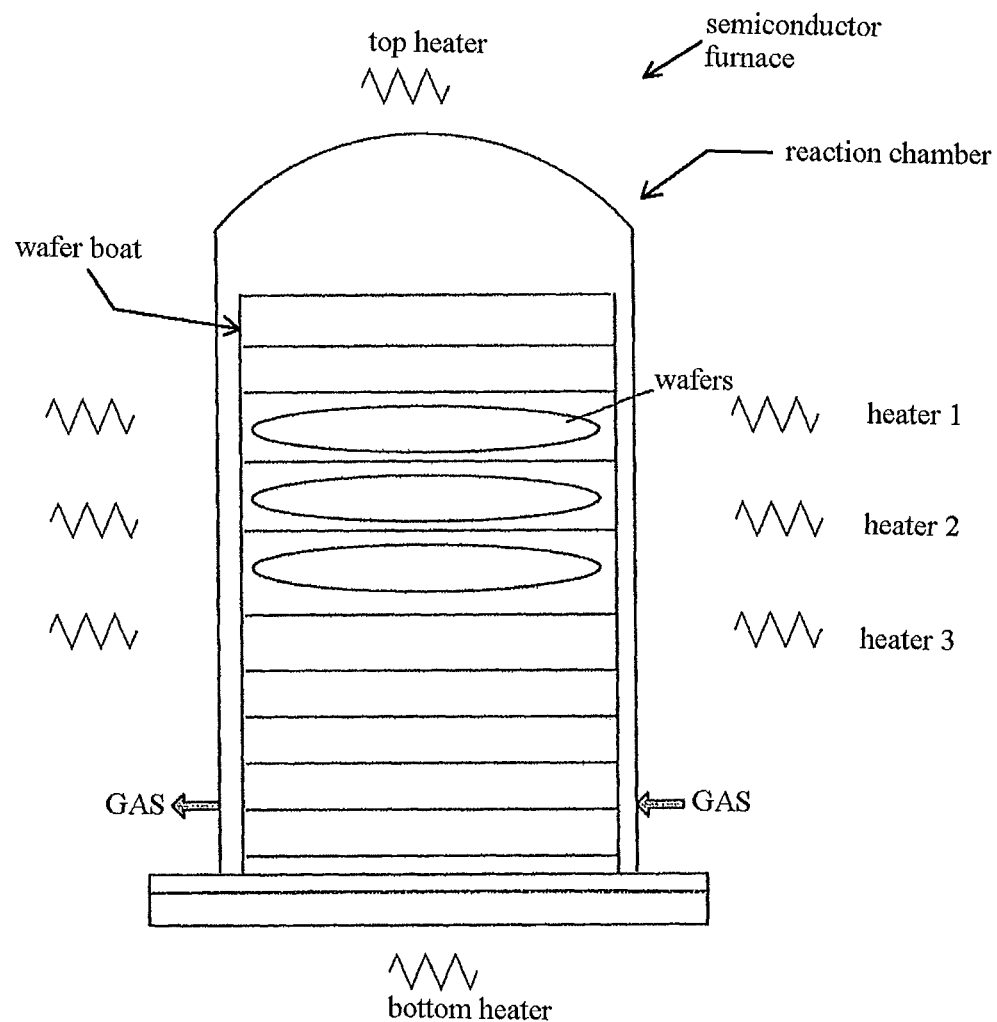
FIG. 2 is a schematic cross-sectional side view of a second existing heater arrangement for a semiconductor furnace.

FIGS. 1 and 2 show schematic diagrams of two conventional heater arrangements used for semiconductor furnaces that process traditional wafer sizes of 300 mm or less. In FIG.

1, there are five sidewall heater zones provided at the sidewall of the CVD reaction chamber. Each heater zone is defined by and includes a heater, which in some embodiments is an electric resistance type heater coil or element. An alternative conventional heater arrangement shown in FIG. 2 includes three sidewall heater zones provided at the sidewall of reaction chamber, one top heater zone, and one bottom heater zone. Conventional electric or electronic heater controls are provided in both of the foregoing heater arrangements that allows the temperature output from each heater to be adjusted by varying the energy input from the electrical power source.

The sidewall heater zones established for the existing heater arrangements shown in FIGS. 1 and 2 are fixed because the sidewall heaters are fixed or stationary in position in relation to the reaction chamber. Accordingly, the vertical spacing between the sidewall heaters cannot be adjusted. In addition, although the wafer boat and wafers retained thereon may be rotated during CVD processing in the semiconductor furnace, the sidewall heaters themselves are typically stationary and cannot be rotated. Therefore, there is little ability to fine tune the sidewall temperature zones and temperature profiles within the reaction chamber with these existing heater arrangements.

When either of these foregoing arrangements is used for CVD processing of the larger next generation 450 mm size wafer, the temperature profiles can be improved and optimized according to the present invention through heater rotation and/or heater spacing adjustment between the sidewall heaters. Fine tuning sidewall heater rotation speed and spacing of the heaters provides more adjustable parameters to tune and obtain the desired process temperature profile with reaction chamber 20.

Figure 3:
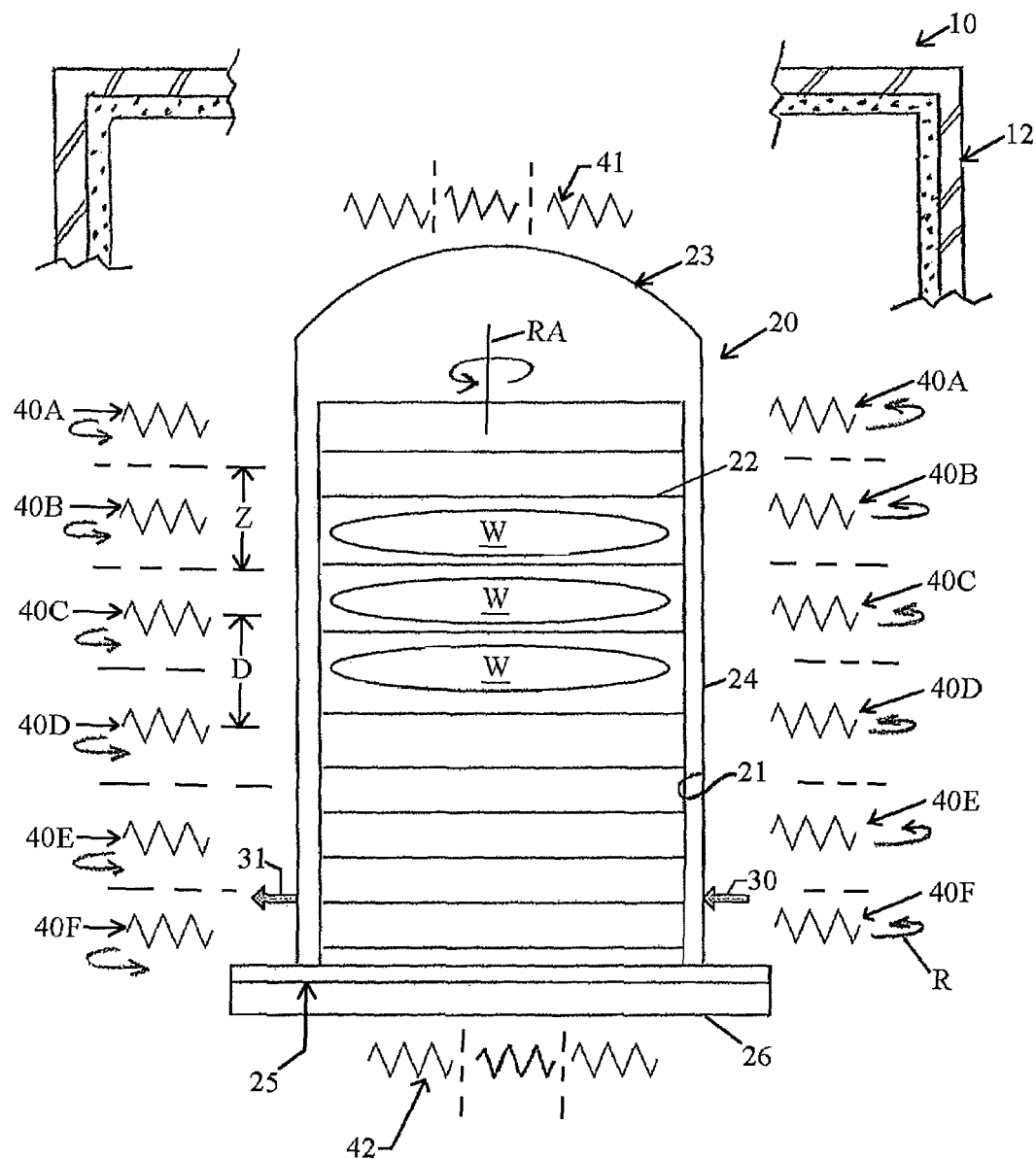
FIG. 3 is a schematic cross-sectional side view diagram of a heater arrangement for a semiconductor furnace according to one embodiment of the present invention.

FIG. 3 is a schematic diagram of one embodiment of a semiconductor processing furnace 10 or tool incorporating a CVD thermal reaction chamber 20 according to the present invention. Semiconductor furnace 10 may include a conventional insulated housing 12 (partially shown in FIG. 3) which is configured and adapted to provide a thermal enclosure around substantially all of reaction chamber 20 to establish a temperature controlled environment for reaction chamber 20. CVD reaction chamber 20 includes an internal cavity 21 defining a space for removably receiving a conventional wafer boat 22 that is configured and adapted for supporting and holding a plurality of vertically-stacked wafers W in a conventional manner. In one embodiment, reaction chamber 20 may have a closed top 23, sidewall 24, and open bottom 25 to allow the wafer boat 22 to be inserted and removed from the chamber for batch processing of wafers W. In one embodiment, wafer boat 22 comprises a conventional open-frame structure such as a ladder-type design having multiple horizontal slots for supporting the wafers W and allowing reactant gas to flow horizontally over the face of the wafers W to build the desired material film thicknesses thereon. Wafer boat 22 may be sized to hold 50-125 wafers W or more in some embodiments; however, any suitable number of wafers may be held by the wafer boat depending on the height of the reaction chamber 20 provided. In some representative embodiments, typical vertical spacing of wafers W in wafer boat 22 may be around 6 to 10 mm. Wafer boat 22 may be made of quartz or any other suitable material commonly used in the art.

Reaction chamber 20 may have a conventional cylindrical shape in one embodiment and may be made of quartz or SiC. Reaction chamber 20 may include a coating such as polysilicon or another coating material typically used depending on the type of process conducted in the chamber. Reaction chamber 20 may have any suitable height or length depending on the number of wafers to be processed in each batch. In some exemplary embodiments, reaction chamber 20 may have a representative vertical height or length of 100-150 cm; however, any suitable height or length may be provided. In some representative embodiments, reaction chamber 20 for processing 450 mm wafers may be sized to be more than 450 mm diameter and a chamber length of about 50 to 200 cm depending on the number of wafers to be processed simultaneously in the chamber.

A sealable and openable bottom closure lid 26 is provided which may be sealed to the bottom 25 of reaction chamber 20 to form a gas-tight chamber seal for processing the wafers W. In one embodiment, bottom 25 may be provided with a flange as shown for receiving lid 26. Bottom closure lid 26 may include a support structure to provide support for wafer boat 22 which may be attached to the lid in a conventional manner.

Other conventional appurtenances typically used in conjunction with CVD reaction chamber 20 processing assemblies and semiconductor furnaces may be provided. For example, reaction gas supply inlet connections 30 and outlet connections 31 may be furnished to allow one or more process gases to be introduced and removed from reaction chamber 20. Gas manifold and injectors, furnace cooling to allow quick changing of wafer batches, an external insulated housing enclosing the reaction chamber 20, wafer boat elevator or lift and robotically-controlled arm for positioning, raising, and lowering the wafer boat 22 into/from chamber 20, etc. (not shown). Some of these appurtenances which may be provided are described, for example, in U.S. Pat. Nos. 6,538, 237; 6,435,865; 6,031,205; and 7,241,701; which are all incorporated herein by reference in their entireties.

In some embodiments, wafer boat 20 may be provided with a conventional motor drive mechanism (not shown) to allow the stack of wafers W to be rotated (see rotational arrow in FIG. 3) during the CVD process to promote uniform thickness of the layer of material deposited on the wafers.

The operation of semiconductor furnace 10 and batch processing of wafers W may be controlled by a suitable commercially-available temperature controllers as conventionally used in the art to regulate the heat output from the furnace heating system including temperature ramp up and ramp down rates.

With continuing reference to FIG. 3, semiconductor furnace 10 includes a plurality of heaters, which preferably are distributed along the sidewall 24, top 23, and bottom 25 of CVD reaction chamber 20. In one embodiment, the heaters include sidewall heaters 40A-40F, top heaters 41, and bottom heaters 42 as shown.

To provide better temperature control and uniform heat distribution throughout the reaction chamber 20 for CVD processing of next generation 450 mm diameter or larger wafers, sidewall heaters 40A-40F in one embodiment are preferably rotatable about a rotational axis RA in relation to reaction chamber 20 as shown in FIG. 3 and further described herein. In one embodiment, rotational axis RA may be axially aligned with the vertical axis or centerline of reaction chamber 20. The sidewall heaters 40A-40F may be independently rotatable in some embodiments, and in other embodiments may be rotatable in unison. Sidewall heaters 40A-40F may be rotatable in a rotational direction, and at varying rotational speeds.

The rotational speed and direction of sidewall heaters 40A-40F are preferably user-adjustable either manually or via a computer controller. In one embodiment, therefore, heater rotation may be controlled via a rotation motor controller and a rotation control signal coming from a motor encoder and close loop control. The rotation motor controller may execute appropriately configured programmable control logic or software to automatically adjust the rotational direction and speed of sidewall heaters 40A-40F. Preferably, sidewall heaters 40A-40F are rotatable independently of the ability to rotate wafer boat 22 and wafers W therein which may be provided in some embodiments.

In other embodiments, the vertical spacing or distance D between each sidewall heaters 40A-40F may be also be adjustable as further described herein to provide the ability to further fine tune the temperature profile within the reaction chamber 20 closer to the desired target temperature profile. Each sidewall heater 40A-40F defines a corresponding heater zone Z as shown in FIG. 3. In some embodiments, therefore, sidewall heaters 40A-40F may be either rotatable, adjustable in vertical distance D, or a combination of both depending on the CVD process temperature control requirements.

The spacing between sidewall heaters 40A-40F are preferably user-adjustable either manually or via a computer controller. In one embodiment, therefore, heater spacing may be controlled by a spacing motor controller and a spacing control signal coming from a motor encoder and close loop control. The spacing motor controller may execute appropriately configured programmable control logic or software to automatically adjust the spacing between the sidewall heaters 40A-40F and relative vertical position of each heater with respect to reaction chamber 20.

In one embodiment, the number of sidewall heaters 40A-40F that are furnished may be selected such that each sidewall heater controls temperature for less than or equal to no more than ten (10) vertically-stacked wafers W per heater to provide better temperature uniformity and corresponding uniformity in wafer level thicknesses both on each wafer W (e.g. from center of wafer to edges thereof) and from wafer-to-wafer in the vertical stack of wafers W supported by the wafer boat 22. This arrangement may further enhance the ability to control CVD process temperature profiles within the reaction chamber 20 close to the desired target profiles.

In some embodiments, the sidewall heaters 40A-40F and heater zones Z may be approximately evenly distributed along the vertical height of the reaction chamber with preferably each heater controlling temperature within a respective heater zone having no more than 10 vertically-stacked wafers W.

With continuing reference to FIG. 3, sidewall heaters 40A-40F in one embodiment may be electric resistance type heaters having controllable heat output which may be regulated by adjusting the energy input to each heater via a variable resistance control such as a rheostat or other suitable similar electrical control device commonly used in the art. Sidewall heaters 40A-40F are preferably disposed proximate to the external sidewall 24 and are arranged in spaced vertical relationship to each other along the height of reaction chamber 20. Sidewall heaters 40A-40F therefore define a plurality of vertical heater zones Z within reaction chamber 20 with the temperature in each zone being controlled by heaters 40A-40F.

The heat output from sidewall heaters 40A-40F may be adjusted and fine tuned to control the temperature in each heater zone Z. The heat output from each sidewall heaters 40A-40F preferably is adjustable independent of the other sidewall heaters. The heat output setting of each sidewall heater may be adjusted either manually by a user or automatically via a heater controller or computer in conjunction with control signals generated by temperature sensors disposed in the semiconductor furnace 10 and/or based on predetermined heater temperature output settings derived from experience and empirical data correlated with the size of wafer being processed and/or type of material film being deposited on the wafers W.

In one embodiment, sidewall heaters 40A-40F may each include one or more conventional electric resistance coils or elements as further described herein that are disposed circumferentially around sidewall of reaction chamber 20 at the outer circumference of reaction chamber 20. Sidewall heaters 40A-40F preferably extend around the entire circumference of reaction chamber 20. FIG. 3 diagrammatically shows the left and right portions of each sidewall heater 40A-40F. The electric resistance coils are electrically coupled via conventional conductors to an electrical power supply, which may be routed through suitable conventional variable resistance electrical controls as typically used in the industry to allow the heat output (e.g. Btuh) to be adjusted from each heater 40A-40F.

Figure 4:
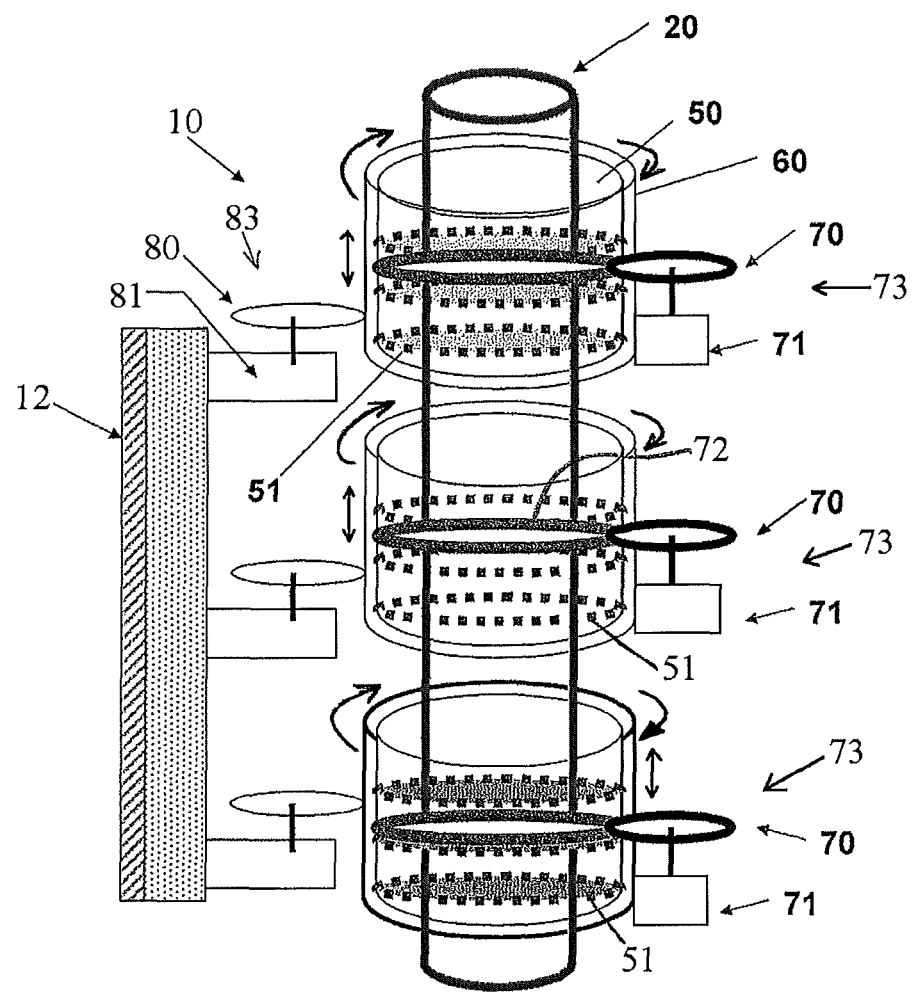
FIG. 4 is a perspective side view of sidewall heaters according to one embodiment of the semiconductor furnace of FIG. 3.
Figure 5:
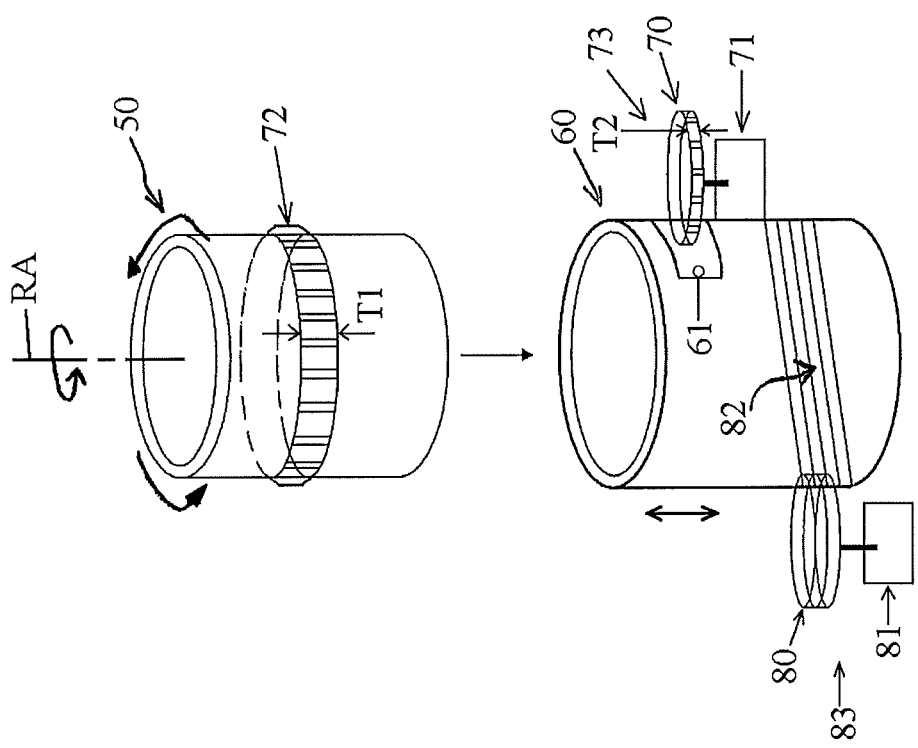
FIG. 5 is a perspective side view of a sidewall heater according to one embodiment of the semiconductor furnace of FIG. 3.

FIGS. 4 and 5 show one possible embodiment of sidewall heaters 40A-40F according to the present invention. In this figure, a portion of semiconductor furnace 10 is shown with three sidewall heaters 40A, 40B, and 40C. Each sidewall heater 40A-40F includes an annular or cylindrically-shaped rotary heater base 50 that may contain one or more electric resistance heater coils or elements 51 preferably mounted on an inward facing interior side of the rotating base. Each sidewall heater 40A-40F defines a respective heater zone Z (see FIG. 3).

According to another aspect of the invention, as further described herein, rotary heater base 50 may be rotatably mounted in an outer support base 60 which is vertically adjustable in position to allow the spacing or distance D between each rotating base 50 to be adjusted. In a preferred embodiment, support base 60 is preferably supported from any portion semiconductor furnace 10 such as housing 12. Preferably, support base 60 is not rotatable with respect to reaction chamber 20 or housing 12, but is vertically adjustable in position with respect to chamber 20.

Referring now to FIG. 4, sidewall heaters 40A, 40B, and 40C may each comprise individual annular-shaped coils or elements 51 that are orientated horizontally with respect to vertical reaction chamber 20. Any suitable configuration, number, and arrangement of electrical heater coils 51 may be used so long as sufficient heat distribution and temperature control is provided. The configuration, number, and arrangement of electrical heater coils 51 therefore will be dictated by the process heating requirements and size of the reaction chamber 20. Accordingly, in some other possible embodiments (not shown), electric heater coil 51 may be configured as a single spiral-shaped element extending helically upwards on the interior side of rotating heater base 50 from the bottom to top of the heater base. In yet other possible embodiments (not shown), heater coil or coils 51 may comprise a plurality of vertically-aligned individual elements disposed on the interior side of rotating heater base 50.

Electric heater coils 51 may be mounted to rotating heater bases 50 by any suitable conventional attachment means. Preferably, rotating heater bases 50 are not rigidly mounted to furnace housing 10 to allow the bases to be rotated with respect to reaction chamber 20 and semiconductor furnace housing 10 as further described herein.

Referring to FIGS. 4 and 5, rotating heater bases 50 are preferably cylindrical in shape in one embodiment and have a diameter larger than reaction chamber 20 to allow the heater base to extend circumferentially around the reaction chamber. In a preferred embodiment, rotating heater bases 50 include an external gear ring 72 disposed on an outer surface thereof for rotating the heater base. Gear ring 72 is annular in shape and extends around the circumference of rotating heater base 50 and is oriented perpendicular to rotational axis RA (see FIG. 3).

In one possible embodiment, gear ring 72 may be formed directly on an outer surface of rotating heater base 50. In other embodiments, gear ring 72 may be formed on a separate collar that may be attached to an outer surface of rotating heater base 50 by any suitable manner commonly used in the art such as with mechanical fasteners, adhesives, welding, shrink or press fitting, etc.

Gear ring 72 may include any suitable type or style of conventional gear teeth and may be for example a spur gear or a helical gear in some exemplary embodiments. Gear ring 72 is configured and adapted to be driven by a complementary-configured motor-driven gear drive 73. Gear drive 73 includes a motor 71 and gear 70 coupled to a motor shaft. Gear 70 is configured and adapted to mesh with gear ring 72 on rotating heater base 50. such that gear 70 and gear ring 72 have matching styles of gear teeth in a preferred embodiment (e.g. spur or helical gears). Gear drive 73 may be any commercially-available drive unit with suitable horsepower and output torque to rotate sidewall heaters 40A-40F.

In one possible embodiment, gear drive 73 may be mounted to outer support base 60 as shown in FIGS. 4 and 5. In other possible embodiments, gear drive 73 may be mounted to any portion of semiconductor furnace 10. In either embodiment, a window 61 is provided that extends completely through support base 60 to allow gear 70 to engage gear ring 72 on rotating heater base 50 as shown in FIG. 5. The vertical extent of window 61 depends on whether gear drive 73 is mounted to support base 60 or a part of furnace 10.

In the first embodiment, referring to FIG. 5 where gear drive 73 is mounted directly to support base 60, window 61 need only have a height sufficient to allow the thickness T1 of gear 70 to extend through the window to mesh with gear ring 72. Both rotating heater base 50 and gear drive 73 remain in the same relative vertical positions when support base is vertically moved upwards or downwards to adjust the space or distance D between pairs of sidewall heaters 40A-40F. In this case, gear ring 72 need only have a vertical thickness T1 approximately equal to vertical thickness T2 of gear 70 of gear drive 73.

Figure 6:
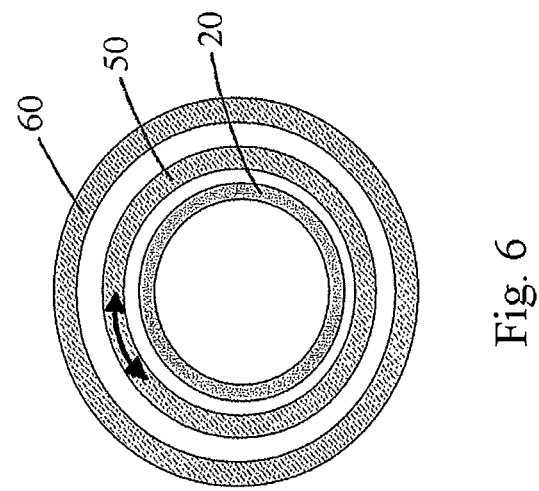
FIG. 6 is a view of a sidewall heater according to one embodiment of the semiconductor furnace of FIG. 3.

In the second embodiment where gear drive 73 is mounted to furnace 10 (not shown), window 61 requires a height large enough to accommodate the maximum distance that is provided for adjusting the vertical position of support base 60. In this case, gear ring 72 must have a thickness T1 that is larger than thickness T2 of gear 70 of gear drive 73 because the gear drive does not move with upwards/downwards with support base 60 and rotating heater base 50. Therefore gear 70 will slide up/down on gear ring 72 which is attached to and remains stationary relative to rotating heater base 50. adjustment Support base 60 preferably rotatably supports rotating heater base 50 such that base 50 may be rotated with respect to support base 60 and reaction chamber 20. Referring to FIGS. 4-6, support base 60 may be cylindrical in shape having a sleeve-like structure that surrounds rotating heater base 50. Support base 60 is preferably concentrically aligned with rotating heater base 50 disposed therein and chamber 20 disposed inside base 50. An annular gap of sufficient size separates support base 60, rotating heater base 50, and reaction chamber 20 to allow base 50 to freely rotate without binding support base 50 or reaction chamber 20. In one possible embodiment, the rotating heater base 50 is mounted with outer support base 60, and the interface between bases 50 and 60 is a metal fluid seal (ring type seal); the base 50 can be rotated independently by itself by motor drive 73.

Referring to FIGS. 3-5, to provide the capability of fine tuning or adjusting the spacing or distance D between the sidewall heaters 40A-40F, an outer surface of support base 60 may include a spiral or helical gear thread or tooth 82 in one embodiment that is disposed thereon. Helical tooth 82 extends in a full 360 degree helical pattern around the outer circumference of support base 60 and extends longitudinally along at least a portion of the height of outer support sleeve 60. The vertical length of helical tooth 82 will determine the maximum range of vertical adjustment for each support base 60 and correspondingly each sidewall heaters 40A-40F. Helical tooth 82 resembles a worm gear formed around the outer circumference of support base 60 and meshes with a complementary-configured gear teeth on gear 80 of a second gear drive 83 as shown in FIGS. 4-5. Gear 80 of gear drive 83 may be any suitable type of gear including for example without limitation a helical gear or spur gear depending on the size and pitch of helical tooth 82 provided. Preferably, when a helical gear is used for gear 80, teeth on gear 80 are of the same hand or orientation as helical tooth 82 on outer support base 60 (i.e., right hand or left hand teeth).

In one preferred embodiment, gear drive 83 may be supported and mounted to semiconductor furnace 10, and more preferably housing 12 or another portion of the furnace or its related appurtenances and structure. Outer support base 60 is preferably not rigidly mounted to semiconductor furnace 10 to allow support base 60 (with rotating heater base 50 disposed therein) to be moved in raising and lowering motions with respect to the furnace In one possible embodiment, helical tooth 82 may be formed directly on an outer surface of support base 60. In other embodiments, helical tooth 82 may be formed on a separate collar that may be attached to an outer surface of support base 60 in any suitable manner commonly used in the art such as by mechanical fasteners, adhesives, welding, shrink or press fitting, etc.

In other possible alternative embodiments (not shown), support base 60 may include a rack and pinion mechanism in lieu of a using helical gear tooth 82. Accordingly, an elongated gear rack may be arranged vertically on an outer surface of the support base that extends parallel to rotational axis RA (see FIG. 3) and which meshes with a suitably configured gear 80 provided with gear drive 83. Gear drive 83 includes a motor 81 and gear 80 coupled to a motor shaft. In one embodiment possible embodiment, gear 80 may be a spur gear. Gear drive 83 provides raising and lowering motions to support sleeve 60 allowing the distance D between sidewall heaters. 40A-40F to be adjusted and positioned to fine tune the temperature profile within reaction chamber 20. The outer support base 60 is preferably carried by furnace or tool housing 12 and rotated by outside rotating motor gear drive 83 as described herein.

Rotating heater bases 50 may be made of any suitable material capable of withstanding the temperatures produced by the heater coils 51 attached thereto. In some representative embodiments, heater bases 50 may preferably be made of stainless steel. Outer support bases 60 may be made of any suitable material capable of withstanding the temperatures produced within the semiconductor furnace 10. In some representative embodiments, support bases 60 may preferably be made of stainless steel.

An exemplary method of operating semiconductor furnace 10 and sidewall heaters 40A-40F will now be provided. Referring to FIGS. 3-6, the method in one possible includes inserting wafer boat 22 holding a plurality of wafers W into reaction chamber 20 (see FIG. 3) and closing bottom closure lid 26 to seal the reaction chamber.

With continuing reference to FIGS. 3-6, the following steps may be performed in any suitable sequence. Sidewall heaters 40A-40F are energized to power electric coils or elements 51 and generate heat to heat reaction chamber 20. Gear drives 73 may be energized to rotate sidewall heaters 40A-40F, and more specifically rotating heater bases 50 engaged by gear 70 of gear drives 73. Preferably, the speed of rotation and/or direction of rotation are independently adjustable for each sidewall heater 40A-40F.

Depending on actual process temperatures monitored in reaction chamber 20 by temperature sensors or past experience in operating the semiconductor furnace 10 for a given CVD process being performed, method may include adjusting the vertical spacing or distance D between some or all of the sidewall heaters 40A-40F to fine tune and optimize the temperature profiles within reaction chamber 20. This may be accomplished by energizing gear drives 83 and raising or lowering outer support bases 60 (supporting and housing rotating heater bases 50 therein) of one or more sidewall heaters 40A-40F; the support bases 60 being engaged with gear 80 of these gear drives. Preferably, the semiconductor furnace 10 and gear drives are arranged so that the vertical position of each heater base 50 corresponding to one of the sidewall heaters 40A-40F is independently adjustable from the others since not all sidewall heaters will necessarily require adjustment to optimize the temperature profile within reaction chamber 20 in every instance. Wafers W may then undergo the desired CVD processing by injecting the appropriate reactant bases into reaction chamber 20. In some embodiments, wafer boat 22 may be rotated by conventional boat drives known to those skilled in the art to further enhance wafer temperature profiles and uniformity in material films deposited on the wafers.

Advantageously, the foregoing method and sidewall heater mechanism improves temperature profile control within the reaction chamber 20 and promotes more uniform film thicknesses deposited on each wafers and from wafer-to-wafer in the process batch during CVD. The electrical resistance of each heater coil or element 51 changes from location to location on each coil after repeated use over a period of time, thereby creating non-uniformity in power and heat output from each coil that may contribute to non-uniform heating of the reaction chamber 20 processing environment. The rotating heater bases 50 are intended to improve the temperature uniformity in the reaction chamber 20 and across each wafer required for uniform film deposits on the wafers. Since each heater coil 51 may exhibit different levels of such electrical resistance changes, the present invention advantageously provides the ability to independently adjust rotational speed and/or direction for each of the sidewall heaters 40A-40F.

Referring to FIG. 3, top heaters 41 may be a bulk shaped electric resistance coils or elements and heater shaped may be varied which base on temperature requirement. Preferably, at least two top heaters 41 and more preferably at least three top heaters are provided to uniform CVD process temperatures in the bottom portion of the reaction chamber 20. Bottom heaters 42 may be a bulk shaped electric resistance coils or elements and heater shaped may be varied based on temperature requirements. Preferably, at least two bottom heaters 42 and more preferably at least three bottom heaters are provided to uniform CVD process temperatures in the bottom portion of the reaction chamber 20. The top and bottom heaters cannot be rotated in some embodiments. The heat output from each top and bottom heater 41, 42 is preferably controllable independently in a conventional manner similar to that described herein for sidewall heaters 40A-40F to allow the temperatures in the top and bottom heater zones of reaction chamber 20 to be fine tuned for optimum CVD processing and minimal variation in film thickness on the wafers.

The wafer film thickness deposition rates are directly proportional to CVD process temperature and reactant gas ratio. Accordingly, precise control of process temperatures within reaction chamber 20 to the maximum extent possible is desirable to minimize variation in film thicknesses deposited by CVD on an individual wafer and wafer-to-wafer basis. Optimally, uniform film thickness is required so that all dies fabricated on each wafer and all dies in the batch from wafer-to-wafer possess the same mechanical, electrical, and reliability properties. If variations in film thicknesses become too large, subsequent semiconductor processing steps as the dies undergo layer-by-layer fabrication through a series of further material deposition and removal steps may be adversely affected as well as the final die integrity. In addition, die failure rates may increase in subsequent wafer level and known good die testing.

Typical CVD process temperatures may vary from about 200-800 degrees C. depending on the type of material to be deposited on the wafers W. During the CVD process, reactant gas is introduced to reaction chamber 20 via the gas inlet connection 30, circulates through the reaction chamber and stack of multiple wafers, and exits the reaction chamber through gas outlet connection 31 as shown in FIG. 3.

Some gases may need to be preheated before entering the reaction chamber. Conventional gas preheating may be provided in some embodiments by use of tape heater upon gas inlet pipes. The heat input by the tape heaters are preferably controllable. These practices are well known to those skilled in the art.

Embodiments of the sidewall heaters of the present invention are different than conventional heaters which typically are fixed in position and cannot be rotated or adjusted in vertical position with respect to the reaction chamber. The present invention therefore advantageously provides heater rotating and spacing adjustment functions for obtaining more parameters that may be adjusted to tune temperature to desired processing profiles.

While the foregoing description and drawings represent preferred or exemplary embodiments of the present invention, it will be understood that various additions, modifications and substitutions may be made therein without departing from the spirit and scope and range of equivalents of the accompanying claims. In particular, it will be clear to those skilled in the art that the present invention may be embodied in other forms, structures, arrangements, proportions, sizes, and with other elements, materials, and components, without departing from the spirit or essential characteristics thereof. In addition, numerous variations in the methods/processes and/or control logic as applicable described herein may be made without departing from the spirit of the invention. One skilled in the art will further appreciate that the invention may be used with many modifications of structure, arrangement, proportions, sizes, materials, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being defined by the appended claims and equivalents thereof, and not limited to the foregoing description or embodiments. Rather, the appended claims should be construed broadly, to include other variants and embodiments of the invention, which may be made by those skilled in the art without departing from the scope and range of equivalents of the invention.

What is claimed is:

1. A semiconductor furnace comprising:
   a vertical thermal reaction chamber for processing a batch of wafers, said vertical thermal reaction chamber having a sidewall defining a height and an internal cavity for removably holding the batch of wafers;
   a wafer boat positionable in the vertical thermal reaction chamber and being configured and adapted to hold a plurality of wafers in vertically-stacked relationship; and
   a heating system comprising:
      a plurality of rotatable sidewall heaters spaced along the height of the reaction chamber, whereby heating by the rotatable sidewall heaters results in a temperature profile within the vertical thermal reaction chamber, the sidewall heaters being rotatable with respect to the vertical thermal reaction chamber about a rotational axis, wherein each sidewall heater is provided on an annular rotating heater base having a gear ring disposed thereon;
      a motor-driven gear drive provided for each of the plurality of sidewall heaters, said motor-driven gear drive engaging the gear ring for rotating the annular rotating heater base and thereby controllably rotating the sidewall heaters for controlling the temperature profile within the vertical thermal reaction chamber while the batch of wafers are being processed in the vertical thermal reaction chamber; and
      a motor controller for controlling the rotation of the sidewall heaters.

2. The semiconductor furnace of claim 1, wherein the sidewall heaters define a plurality of sidewall heater zones in the vertical thermal reaction chamber that are vertically spaced along the height of the vertical thermal reaction chamber with temperature in each heater zone being controlled by a respective sidewall heater, the sidewall heater zones being adjustable in vertical position with respect to the vertical thermal reaction chamber.

3. The semiconductor furnace of claim 2, wherein each sidewall heater has a rotational speed that is independently adjustable from the other sidewall heaters.

4. The semiconductor furnace of claim 1, wherein each sidewall heater has a heat output that is independently adjustable from the other sidewall heaters.

5. The semiconductor furnace of claim 1, wherein the sidewall heaters are electric resistance type coils.

6. The semiconductor furnace of claim 1, further comprising at least one top heater and at least one bottom heater.

7. The semiconductor furnace of claim 1, wherein each sidewall heater has an annular shape and extends circumferentially around the vertical thermal reaction chamber.

8. The semiconductor furnace of claim 1, wherein the heating system further comprising:
   an outer annular support base for each of the annular rotatable heater base, said outer annular support base rotationally supporting the annular rotatable heater base, said annular support base having a helical gear thread provided around the outer circumference of the support base; and
   a second motor-driven gear drive for each of the annular support base, wherein the motor-driven gear drive engages the helical gear thread of the annular support base for controllably adjusting the vertical position of the support base with respect to the vertical thermal reaction chamber.

9. The semiconductor furnace of claim 1, wherein the heating system further comprising:
   an outer annular support base for each of the annular rotatable heater base, said outer annular support base rotationally supporting the annular rotatable heater base, said annular support base having a helical gear thread provided around the outer circumference of the support base; and
   a second gear drive for each of the annular support base, wherein the gear drive engages the helical gear thread of the annular support base for controllably adjusting the vertical position of the support base with respect to the vertical thermal reaction chamber.

10. A semiconductor furnace comprising:
    a vertical thermal reaction chamber having a sidewall defining a height and an internal cavity for removably holding a batch of wafers;
    a wafer boat positionable in the vertical thermal reaction chamber and being configured and adapted to hold a plurality of wafers in vertically-stacked relationship; and
    a heating system comprising a plurality of sidewall heaters spaced vertically along the height of the vertical thermal reaction chamber, the heating system comprising:
       an annular rotatable heater base for each of the plurality of the sidewall heaters, wherein each sidewall heater is provided on the annular rotatable heater base;
       an outer annular support base for each of the annular rotatable heater base, said outer annular support base rotationally supporting the annular rotatable heater base, said annular support base having a helical gear thread provided around the outer circumference of the support base; and
       a motor-driven gear drive for each of the annular support base, wherein the motor-driven gear drive engages the helical gear thread of the annular support base for controllably adjusting the vertical position of the support base with respect to the vertical thermal reaction chamber.

11. The semiconductor furnace of claim 10, wherein each of the annular rotating heater base having a gear ring disposed thereon and a second motor-driven gear drive, said second motor-driven gear drive engaging the gear ring for rotating the heater base and thus the sidewall heater.

12. The semiconductor furnace of claim 11, wherein each sidewall heater has a rotational speed that is independently adjustable from the other sidewall heaters.

13. The semiconductor furnace of claim 10, wherein the sidewall heaters define a plurality of sidewall heater zones in the vertical thermal reaction chamber that are vertically spaced along the height of the vertical thermal reaction chamber with temperature in each heater zone being controlled by a respective sidewall heater, the sidewall heater zones being adjustable in vertical position with respect to the vertical thermal reaction chamber.

14. The semiconductor furnace of claim 10, wherein each sidewall heater has a heat output that is independently adjustable from the other sidewall heaters.

15. The semiconductor furnace of claim 10, wherein the sidewall heaters are electric resistance type coils.

16. The semiconductor furnace of claim 10, further comprising at least one top heater and at least one bottom heater.

17. The semiconductor furnace of claim 10, wherein each sidewall heater has an annular shape and extends circumferentially around the vertical thermal reaction chamber.

* * * * *